US006426288B1

(12) United States Patent
Meikle

(10) Patent No.: US 6,426,288 B1
(45) Date of Patent: *Jul. 30, 2002

(54) METHOD FOR REMOVING AN UPPER LAYER OF MATERIAL FROM A SEMICONDUCTOR WAFER

(75) Inventor: Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/382,218

(22) Filed: Aug. 24, 1999

Related U.S. Application Data

(63) Continuation of application No. 08/704,328, filed on Aug. 28, 1996, now Pat. No. 5,942,449.

(51) Int. Cl.[7] .................................. H01L 21/302
(52) U.S. Cl. .................. 438/650; 438/691; 438/692
(58) Field of Search ............................. 438/692, 691, 438/690, 745, 747, 749, 750, 753

(56) References Cited

U.S. PATENT DOCUMENTS

| 3,914,138 | A | | 10/1975 | Rai-Choudhury | ........... 148/186 |
| 4,954,189 | A | | 9/1990 | Hahn et al. | ............... 148/33.2 |
| 5,043,044 | A | | 8/1991 | Hattori et al. | ............... 156/645 |
| 5,084,419 | A | * | 1/1992 | Sakao | ......................... 438/460 |
| 5,244,534 | A | * | 9/1993 | Yu et al. | ....................... 438/672 |
| 5,318,663 | A | * | 6/1994 | Buti et al. | ................... 438/404 |
| 5,429,711 | A | * | 7/1995 | Watanabe et al. | ............. 216/52 |
| 5,502,008 | A | | 3/1996 | Hayakawa et al. | ......... 437/225 |
| 5,529,950 | A | * | 6/1996 | Hoenlein et al. | ........... 438/107 |
| 5,580,821 | A | | 12/1996 | Mathews et al. | ........... 437/187 |
| 5,622,636 | A | * | 4/1997 | Huh et al. | ...................... 438/5 |
| 5,622,875 | A | * | 4/1997 | Lawrence | .................. 438/691 |
| 5,627,110 | A | | 5/1997 | Lee et al. | .................... 438/692 |
| 5,639,388 | A | * | 6/1997 | Kimura et al. | ................. 216/84 |
| 5,647,952 | A | * | 7/1997 | Chen | .............................. 438/8 |
| 5,683,282 | A | | 11/1997 | Liu et al. | ....................... 445/50 |
| 5,776,808 | A | * | 7/1998 | Muller et al. | ............... 438/243 |
| 5,851,928 | A | * | 12/1998 | Cripe et al. | ................. 438/748 |
| 5,942,449 | A | * | 8/1999 | Meikle | ....................... 438/747 |
| 6,127,279 | A | * | 10/2000 | Konuma | ...................... 438/745 |

* cited by examiner

Primary Examiner—Benjamin L. Utech
Assistant Examiner—Binh X. Tran
(74) Attorney, Agent, or Firm—Dorsey & Whitney LLP

(57) ABSTRACT

A method for removing a portion of an upper layer of one material from an underlying layer of another material to form a uniformly planar surface on a semiconductor wafer. In accordance with one embodiment of the invention, an upper section of the upper layer is etched to an intermediate point in the upper layer. The etching step removes the upper section of the upper layer and leaves only a lower section of the upper layer on the wafer. The lower section of the upper layer is then planarized to a final endpoint. The etching step preferably moves the majority of the upper layer from the wafer so that the remaining portion of the upper layer is thick enough to allow the planarization step to produce a uniformly planar finished surface on the wafer.

18 Claims, 2 Drawing Sheets

METHOD FOR REMOVING AN UPPER LAYER OF MATERIAL FROM A SEMICONDUCTOR WAFER

CROSS-REFERENCE TO RELATED APPLICATION

This application is a continuation of pending U.S. patent application Ser. No. 08/704,328, filed Aug. 28, 1996 now U.S. Pat. No. 5, 942,449.

TECHNICAL FIELD

The present invention relates to removing an upper layer of material from an underlying layer on a semiconductor wafer, and more particularly, to forming highly planarized contact plugs on a semiconductor wafer.

BACKGROUND OF THE INVENTION

Microelectronic devices are small, complex electronic devices manufactured on a substrate made from glass or a suitable semiconductive material. Typical microelectronic devices have many component layers upon which small components are formed, and several insulator layers that electrically isolate the component layers from one another. The individual components are electrically coupled together by conductive interconnects made from polysilicon, aluminum, tungsten, or other suitable conductive materials.

One type of interconnect is a contact plug that extends substantially vertically through an insulator layer. Contact plugs are fabricated by etching vias through an insulator layer, and then depositing a conductive material into the vias and over the insulator layer. As shown in FIG. 1, for example, a lower layer 20 is covered by an insulator layer 30, and vias 32 are etched through the insulator layer 30. An upper layer of conductive material 40 is then deposited into the vias 32 and over the insulator layer 30. A number of contact plugs 42 are formed in the vias 32 by removing the blanket portion 40(a) of the conductive layer 40 and a small amount of material from the top surface 33 of the insulator layer 30. The contact plugs 42 are thus electrically isolated from one another along the top surface 33 of the insulator layer 30. In use, the contact plugs 42 electrically couple the lower layer 20 to other devices that are subsequently formed on top of the insulator layer 30.

In the competitive semiconductor industry, it is desirable to maximize the throughput of finished wafers. The throughput of fabricating contact plugs is a function of several factors, one of which is the rate at which the blanket portion of the conductive upper layer is removed from the wafer. Because the throughput increases with increasing removal rates, it is generally desirable to maximize the rate at which the conductive material is removed from the wafer.

The finished surface of the wafer, however, must also be uniformly planar so that additional circuit patterns may be accurately focused on top of the contact plugs and the insulator layer. As the density of integrated circuits increases, it is often necessary to accurately focus the critical dimensions of the circuit patterns to better than tolerance of approximately 0.1 µm. Yet, focusing circuit patterns to such small tolerances is very difficult when the distance between the lithographic energy source and the surface of the wafer varies because the wafer is not uniformly planar. Several devices may in fact be defective on a wafer with a non-uniformly planar surface. Therefore, the finished surface of the insulator layer and the contact plugs must be a highly uniform, planar surface.

One existing method for forming contact plugs and other interconnects is to wet etch the upper conductive layer down to the insulator layer. Wet etching processes involve depositing an etching solution onto the conductive layer that dissolves the material of the conductive layer. In spin wet etching, which is a particular type of wet etching process, the etching solution is applied through a scanning dispense station onto the conductive layer as the wafer rotates at a high angular velocity. Wet etching, and particularly spin wet etching, rapidly remove large volumes of material from the upper conductive layer. Spin wet etching accordingly provides a high throughput of finished wafers. However, neither static wet etching nor spin wet etching produces a uniformly planar surface. Wet etching is difficult to control and one region of the wafer may be over-etched while another region may be under-etched. Spin etching removes material across the wafer more uniformly than wet etching, but the etchant still may remove or over-etch an upper layer in specific regions such as contact plugs. Therefore, wet etching techniques are generally undesirable methods for forming contact plugs or other interconnects.

Another existing method for fabricating contact plugs is to planarize the conductive material with a chemical-mechanical planarization ("CMP") process. In a typical CMP process, a wafer is exposed to an abrasive medium under controlled chemical, pressure, velocity, and temperature conditions. Examples of abrasive mediums include slurry solutions and polishing pads. The slurry solutions generally contain small, abrasive particles that abrade the surface of the wafer, and chemicals that etch and/or oxidize the surface of the wafer. The polishing pads are generally planar pads made from a relatively porous material, and they may also contain abrasive particles to abrade the wafer. Thus, when the polishing pad and the wafer move with respect to each other, material is removed from the surface of the wafer mechanically by the abrasive particles in the pad and/or the slurry, and chemically by the chemicals in the slurry. CMP processes are highly desirable because they produce a uniformly planar surface on the wafer. However, compared to wet etching techniques, CMP processes remove material from the wafer at a much slower rate. Thus, CMP processes are time-consuming and have a lower throughput than wet etching techniques.

In light of the problems with existing methods for forming contact plugs and other interconnects on a semiconductor wafer, it would be desirable to develop a method that produces a uniformly planar surface on the wafer while maintaining a high throughput of finished wafers.

SUMMARY OF THE INVENTION

The present invention is a method for removing a portion of an upper layer of material from an underlying layer to form a uniformly planar surface on a semiconductor wafer. In accordance with one embodiment of the invention, an upper section of the upper layer is etched to an intermediate point in the upper layer that may be above, below, or flush with a top surface of the underlying layer. The etching step removes the upper section of the upper layer and leaves only a lower section of the upper layer on the wafer. The lower section of the upper layer is then planarized to a final endpoint. The etching step preferably moves the majority of the upper layer from the wafer so that the remaining portion of the upper layer is just thick enough to allow the planarizing step to produce a uniformly planar surface on the wafer.

The etching step is preferably a spin wet etching process in which an etching solution is deposited onto the upper layer while the wafer rotates at a relatively high angular velocity. The centrifugal force generated by the wafer spreads the etching solution across the upper layer to enhance the uniformity of the removal of material from the upper layer. The position at which the etching solution is deposited onto the polishing pad and the scanning of the dispensing position over the polishing pad are preferably controlled to enhance the uniformity of the spin etching step. The planarizing step is preferably a CMP process in which the upper layer is pressed against a polishing medium, and at least one of the wafer or the polishing medium is moved with respect to the other to planarize the upper layer to a uniformly planar surface.

DETAILED DESCRIPTION OF THE INVENTION

Figure 1:
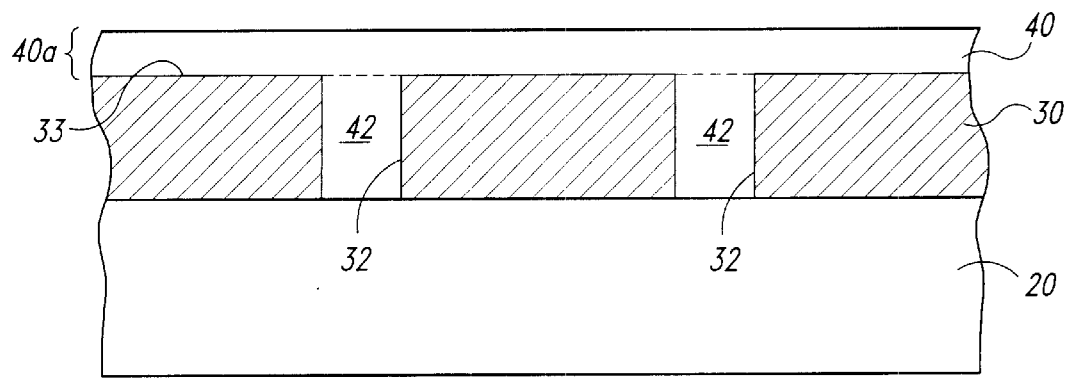
FIG. 1 is a schematic cross-sectional view of a semiconductor wafer before contact plugs are formed in an insulator layer in accordance with the prior art.
Figure 2:
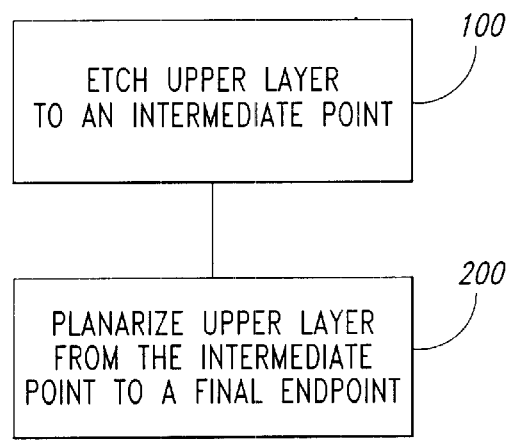
FIG. 2 is a flow chart of a method of the invention.
Figure 3:
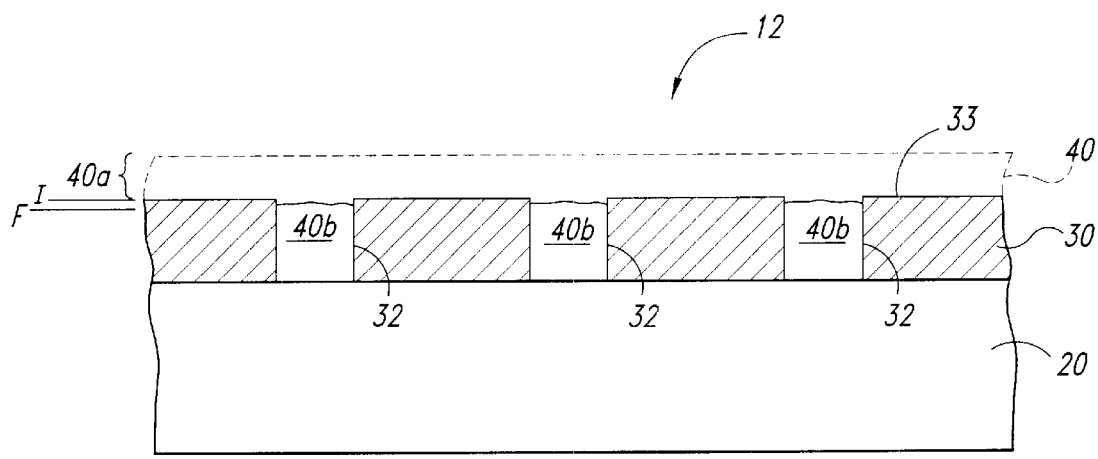
FIG. 3 is a schematic cross-sectional view of a semiconductor wafer at one point in a method of the invention.
Figure 4:
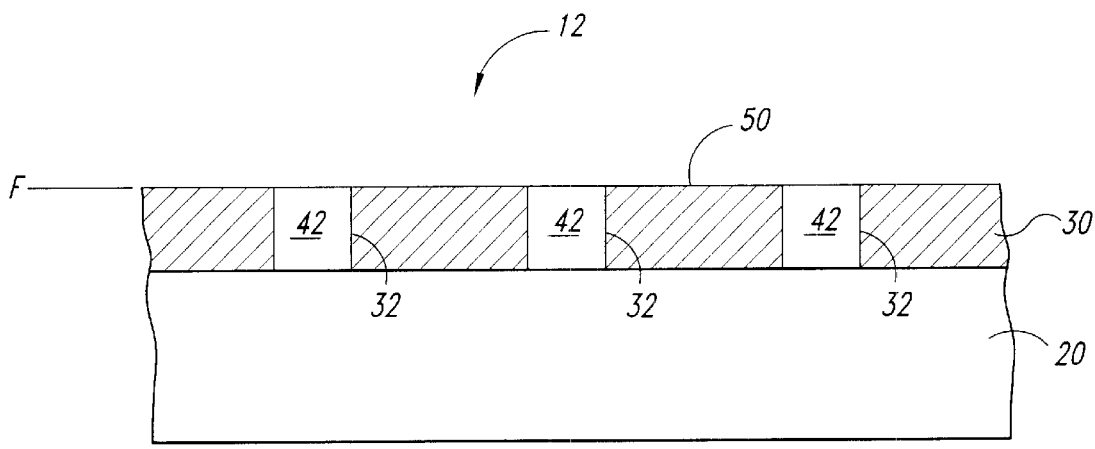
FIG. 4 is a schematic cross-sectional view of the semiconductor wafer of FIG. 3 at another point in a method of the invention.

The present invention is a method for quickly removing a portion of an upper layer from an underlying layer that produces a uniformly planar surface on a semiconductor wafer. An important aspect of the invention is to initially etch the upper layer to an intermediate point with a fast wet etching process. The intermediate point is generally selected so that the etching process removes most of the material that is desirably removed from the upper layer. Another important aspect of the invention is to subsequently planarize a final portion of the upper layer to a final endpoint with a CMP process. The CMP process generally removes just enough material to produce a uniformly planar surface on the wafer. By removing most of the material from the upper layer with a wet etching process, and by removing only a small, final portion of material with a CMP process, the present invention capitalizes on the high removal rate of wet etching processes and the highly uniform and planar surfaces produced by CMP processes. Therefore, compared to conventional CMP processes, the present invention enhances the throughput of finished wafers without sacrificing the uniformity and planarity of the finished planarized surface on the wafer. FIGS. 2–4, in which like reference numbers refer to like parts throughout the various figures, illustrate a method of the invention for forming contact plugs from an upper conductive layer.

FIG. 2 illustrates the steps of a method in accordance with the invention for removing a portion of an upper layer from an underlying layer to form a uniformly planar surface on a semiconductor wafer. In general, a semiconductor wafer (not shown) has an upper layer deposited over an underlying layer and into trenches or vias formed in the underlying layer. The first step 100 of the method is to etch the upper layer to an intermediate point.

FIG. 3 illustrates a wafer 12 at the first step 100 of the method shown in FIG. 2. The wafer 12 has a lower layer 20, an underlying layer 30 disposed on the lower layer 20, and an upper layer 40 deposited over the underlying layer 30. A number of vias 32 extend through the underlying layer 30 from the lower layer 20 to the upper layer 40. More particularly, FIG. 3 shows the wafer 12 after an upper layer 40 has been etched to an intermediate point I in accordance with the first step 100 shown in FIG. 2. The etching step 100 removes a blanket or upper section 40($a$) of the upper layer 40 so that a lower section 40($b$) of the upper layer 40 remains on the wafer 12. The lower section 40($b$) of the upper layer 40 is generally the portion of the upper layer 40 that is proximate to the top surface 33 of the underlying layer 30. As shown in FIG. 3, the lower section 40($b$) of the upper layer 40 is preferably the portion of the upper layer 40 in the vias 32 and below the top surface 33 of the underlying layer 30. In general, the intermediate point I defines the boundary between the upper section 40($a$) and the lower section 40($b$) of the upper layer 40.

The intermediate point I is generally selected to coincide with the top surface 33 of the underlying layer 30. However, the intermediate point I may be selected at any other location above a final endpoint F. The intermediate point I is preferably selected so that most of the upper layer 40 is removed by the wet etching process to capitalize on the extremely high removal rate of wet etching processes. Therefore, the intermediate point I is generally relatively close to the final endpoint F of the finished wafer.

The etching process preferably removes the material of the upper layer 40 without removing a significant amount of material from the underlying layer 30. In one suitable wet etching process, a liquid etchant is applied to the upper section 40($a$) of the upper layer 40. The liquid etchant dissolves the material of the upper layer 40 until the surface of the upper layer 40 approaches the intermediate point I. At this point, the etching solution is generally removed from the surface of the wafer 12.

In a preferred embodiment, the etching process is a spin wet etching process in which an etching solution is applied or deposited onto the surface of the wafer 12 as the wafer 12 is rotated at a relatively high angular velocity. The etching solution is preferably highly selective to the underlying layer, while providing good etching uniformity and control to inhibit overetching that creates recesses or under-etching that leaves residuals on the wafer. The etching solution preferably etches the upper layer at a rate of between approximately 100 and 2000 angstroms per minute, and it preferably etches the underlying layer at a rate of less than approximately 50 angstroms per minute. To provide better control and uniformity with such a highly selective etching solution, the viscosity of the etching solution is increased with phosphoric acid or other more viscous substances so that the etching solution does not readily flow into submicron features. The etching solution, therefore, preferably has a viscosity between approximately 0.5 cP and approximately 100 cP, and more preferably between 15 cP and 30 cP (viscosity measurements at 25° C.). For example, an etching solution made from phosphoric acid, nitric acid, and hydrofluoric acid is deposited onto the upper section 40($a$) of the upper layer 40 while the wafer 12 rotates at approximately 2,000 rpm. The ratio of phosphoric acid to nitric acid to hydrofluoric acid is preferably between 50:50:0.5 to 150:150:5.0, respectively. The flow rate of the etching solution is approximately between 100–1000 ml/min, and preferably approximately between 150–250 ml/min. Suitable spin wet etching machines are manufactured by SEZ, of Phoenix, Ariz.

Referring again to FIG. 2, the second step 200 of a method in accordance with the invention is to planarize the upper layer 40 from the intermediate endpoint I to the final endpoint F. FIG. 4 illustrates the wafer 12 after the upper layer 40 and the underlying layer 30 have been planarized to the final endpoint F. In a preferred embodiment, the planarizing step is performed by a CMP process that produces a highly uniform, planar surface 50. The planarization step 200 preferably removes only a small portion of material from the wafer 12 to produce the highly uniform planar surface. Accordingly, the distance between the intermediate point I and the final endpoint F is preferably minimized so that a very large percentage of the upper layer 40 is removed by the fast wet etching process. The planarization step 200, therefore, is preferably a touch-up step to enhance the uniformity and planarity of the finished surface 50 and to ensure that the contact plugs 42 are electrically isolated from one another across the top of the finished surface 50.

It will be appreciated that before the planarizing step 200, the top surface 33 of the underlying layer 30 (shown in FIG. 3) is not necessarily highly planar as shown. Rather, the top surface 33 may have a non-planar topography that must be planarized to a highly planar surface. Thus, the planarization step 200 also ensures that whole surface of the wafer, including the top surface of underlying layer 30, is planarized to a highly planar surface.

One advantage of the present invention is that it significantly increases the throughput in a semiconductor wafer processing without sacrificing the uniformity and planarity of the finished surface. The etching step of the present invention removes most of the upper layer much faster than if the same portion of the upper layer was removed by a CMP process. The remaining section of the upper layer is removed by a CMP process to produce a uniformly planar surface on the wafer. Importantly, the finished surface on the wafer is the same with the present invention as with conventional removal methods that remove the entire upper layer with a CMP process. The present invention accordingly recognizes that only the last portion of the upper layer needs to be removed by CMP processing to produce a uniformly planar surface. Therefore, the present invention increases the throughput of semiconductor processing and produces a uniformly planar surface on the semiconductor wafers.

From the foregoing it will be appreciated that, although specific embodiments of the invention have been described herein for purposes of illustration, various modifications may be made without deviating from the spirit and scope of the invention. In addition to forming contact plugs, the present invention may be used to form interconnect lines, capacitor structures, or other conductive structures embedded in an insulator layer of a semiconductor wafer. For example, damascene lines may be formed with the present invention by depositing the conductive material into trenches (not shown) on the surface the insulator layer, spin etching the conductive material from the wafer to an intermediate endpoint, and then planarizing the etched material to a final endpoint. Accordingly, the invention is not limited except as by the appended claims.

What is claimed is:

1. In semiconductor device manufacturing, a method for removing a portion of an upper layer from an approximately planar and continuous underlying surface to form a uniformly planar surface on a semiconductor wafer, the method comprising:

etching the upper layer to an intermediate point, the etching removing an upper section of the upper layer and leaving a lower section of the upper layer on the wafer, wherein the upper layer comprises a continuous layer of polysilicon deposited on the approximately planar and continuous underlying surface, and the etching comprises wet spin etching the polysilicon with an etching solution; and planarizing the lower section of the upper layer to a final endpoint with a chemical-mechanical planarization process.

2. The method of claim 1 wherein the etching solution comprises phosphoric acid, nitric acid, and hydrofluoric acid.

3. The method of claim 1 wherein the etching solution has a viscosity between approximately 0.5 cP and approximately 100 cP at 25° C.

4. The method of claim 1 wherein the etching solution etches polysilicon at a rate of between approximately 100 and 2000 angstroms per minute.

5. The method of claim 1 wherein the etching solution comprises a solution having a ratio of 50–150 percent by weight phosphoric acid to 50–150 percent by weight nitric acid to 0.5–5.0 percent by weight hydrofluoric acid.

6. The method of claim 1 wherein the etching further comprises:

holding the wafer in a wafer carrier of a chemical-mechanical planarization machine;

pressing the wafer against the etching solution at a station of the chemical-mechanical planarization machine; and rotating the wafer carrier and the wafer to spin etch the upper layer.

7. A method for forming electrically isolated conductive features made from an upper conductive layer of material deposited onto an approximately planar top surface of a continuous insulating layer and into vias formed in the insulating layer, the method comprising:

etching the conductive layer of material to an intermediate point by wet spin etching the upper conductive layer, wherein the etching solution comprises a solution having a ratio of 50–150 percent by weight phosphoric acid to 50–150 percent by weight nitric acid to 0.5–5.0 percent by weight hydrofluoric acid and the intermediate point is at an elevation proximate to the approximately planar top surface of the continuous insulating layer, and wherein the conductive layer comprises a layer of polysilicon that is continuously deposited onto the top surface of the insulating layer and contiguously extends into the vias; and planarizing the conductive layer and the top surface of the insulating layer to form a planarized surface at a final endpoint, wherein conductive material in one via is electrically isolated from conductive material in adjacent vias.

8. The method of 7 wherein the planarizing step comprises a chemical-mechanical planarization process.

9. The method of claim 8 wherein the chemical-mechanical planarization process comprises:

pressing the conductive layer against a polishing medium; and moving at least one of the polishing medium and the wafer with respect to the other to impart relative motion therebetween, the abrasive medium removing material from the conductive layer to form a uniformly planar surface on the wafer.

10. The method of claim 8 wherein the spin etching further comprises:

holding the wafer in a wafer carrier of a chemical-mechanical planarization machine;

pressing the wafer against the etching solution at a station of the chemical-mechanical planarization machine; and rotating the wafer carrier and the wafer to spin etch the upper layer.

11. In semiconductor device manufacturing, a method for removing a portion of an upper layer from an approximately planar and continuous underlying surface to form a uniformly planar surface on a semiconductor wafer, the method comprising:

etching the upper layer to an intermediate point, the etching comprising performing a selective spin wet etch and removing a major portion of the upper layer and leaving a lower section of the upper layer on the wafer wherein the upper layer comprises a continuous layer of polysilicon deposited on the approximately planar and continuous underlying surface, and removing a portion of the lower section to a final endpoint by means other than etching.

12. The method of claim 11 wherein the removing step comprises chemical-mechanical planarization.

13. In semiconductor device manufacturing, a method for removing a portion of an upper layer from an approximately planar and continuous underlying surface to form a uniformly planar surface on a semiconductor wafer, the method comprising:

removing a major portion of the upper layer by a selective spin wet etch, the removing leaving a lower section of the upper layer on the wafer, wherein the upper layer comprises a continuous layer of polysilicon deposited on the approximately planar and continuous underlying surface; and planarizing the lower section to a final endpoint.

14. The method of claim 13 wherein the planarizing step comprises chemical-mechanical planarization.

15. In semiconductor device manufacturing, a method for removing a portion of an upper layer from an approximately planar and continuous underlying surface to form a uniformly planar surface on a semiconductor wafer, the method comprising:

etching the upper layer to an intermediate point, the etching removing an upper section of the upper layer and leaving a lower section of the upper layer on the wafer, wherein the upper layer comprises a continuous layer of polysilicon deposited on the approximately planar and continuous underlying surface, and wherein etching comprises spin etching the upper layer by applying an etching solution onto the upper layer as the wafer rotates; and planarizing the lower section of the upper layer to a final endpoint by a chemical-mechanical planarization process.

16. In semiconductor device manufacturing, a method for removing a portion of an upper layer from an approximately planar and continuous underlying surface to form a uniformly planar surface on a semiconductor wafer, the method comprising:

etching the upper layer to an intermediate point, the etching removing an upper section of the upper layer and leaving a lower section of the upper layer on the wafer wherein the upper layer comprises a continuous layer of polysilicon deposited on the approximately planar and continuous underlying surface, and wherein the etching comprises etching the upper layer by applying an etching solution onto the upper layer as the wafer rotates; and planarizing the lower section of the upper layer to a final endpoint by a chemical-mechanical planarization process comprising pressing the upper layer against a polishing medium, and moving at least one of the polishing medium and the wafer with respect to the other to impart relative motion therebetween, the abrasive medium removing material from the upper layer to form a uniformly planar surface on the wafer.

17. A method for forming electrically isolated conductive features made from an upper conductive layer of material deposited onto an approximately planar top surface of a continuous insulating layer and into vias formed in the insulating layer, the method comprising:

etching the conductive layer of material to an intermediate point by spin etching the conductive layer by applying an etching solution onto the conductive layer as the wafer rotates, wherein the upper conductive layer comprises a continuous layer of polysilicon deposited on the approximately planar top surface of the continuous insulating layer, and wherein the intermediate point is at an elevation proximate to the top surface of the insulating layer; and planarizing the conductive layer and the top surface of the insulating layer to form a planarized surface at a final endpoint by a chemical-mechanical planarization process, the chemical-mechanical planarization process comprising pressing the conductive layer against a polishing medium, and moving at least one of the polishing medium and the wafer with respect to the other to impart relative motion therebetween, the abrasive medium removing material from the conductive layer to form a uniformly planar surface on the wafer, and wherein conductive material in one via is electrically isolated from conductive material in adjacent vias.

18. A method for forming electrically isolated conductive features made from an upper conductive layer of material deposited onto an approximately planar top surface of a continuous insulating layer and into vias formed in the insulating layer, the method comprising:

etching the conductive layer of material to an intermediate point by spin etching the conductive layer by applying an etching solution onto the conductive layer as the wafer rotates, the etching further comprising holding the wafer in a wafer carrier of a chemical-mechanical planarization machine, pressing the wafer against the etching solution at a station of the chemical-mechanical planarization machine, and rotating the wafer carrier and the wafer to spin etch the upper layer, wherein the upper conductive layer comprises a continuous layer of polysilicon deposited on the approximately planar top surface of the continuous insulating layer, and wherein the intermediate point is at an elevation proximate to the top surface of the insulating layer; and planarizing the conductive layer and the top surface of the insulating layer by a chemical-mechanical planarization process comprising pressing the conductive layer against a polishing medium, and moving at least one of the polishing medium and the wafer with respect to the other to impart relative motion therebetween, the abrasive medium removing material from the conductive layer to form a uniformly planar surface on the wafer, to form a planarized surface at a final endpoint, and wherein conductive material in one via is electrically isolated from conductive material in adjacent vias.

* * * * *